United States Patent
Tews et al.

(10) Patent No.: US 6,967,147 B1
(45) Date of Patent: Nov. 22, 2005

(54) NITROGEN IMPLANTATION USING A SHADOW EFFECT TO CONTROL GATE OXIDE THICKNESS IN DRAM SEMICONDUCTOR

(75) Inventors: Helmut Horst Tews, Poughkeepsie, NY (US); Jochen Beintner, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/714,356

(22) Filed: Nov. 16, 2000

(51) Int. Cl.[7] .............................................. H01L 21/76
(52) U.S. Cl. .................. 438/440; 438/520; 438/525; 438/531; 438/981
(58) Field of Search ...................... 438/296, 424, 438/438, 423, 279, 407, 440, 520, 525, 528, 438/531, 981

(56) References Cited

U.S. PATENT DOCUMENTS

| 4,454,524 A | 6/1984 | Spence .......................... 357/23 |
|---|---|---|
| 5,330,920 A | 7/1994 | Soleimani et al. ........... 438/703 |
| 5,920,779 A | 7/1999 | Sun et al. .................... 438/275 |
| 6,037,639 A | 3/2000 | Ahmad ........................ 257/401 |
| 6,080,682 A | 6/2000 | Ibok ............................ 438/770 |
| 6,087,214 A | 7/2000 | Cunningham |
| 6,323,106 B1 * | 11/2001 | Huang et al. ................ 438/433 |
| 6,413,826 B2 * | 7/2002 | Kim ............................ 438/287 |

FOREIGN PATENT DOCUMENTS

EP          0 884 776 A2       12/1998

* cited by examiner

*Primary Examiner*—Jack Chen
(74) *Attorney, Agent, or Firm*—Slater & Matsil, L.L.P.

(57) ABSTRACT

Process for forming dual gate oxides for DRAMS by incorporating different thicknesses of gate oxides by using nitrogen implantation. Either angled nitrogen implantation or nitride spacers is used to create a "shadow effect" or area, which limits the nitrogen dose close to the edges of the active area. The reduction of nitrogen dose leads to an increased gate oxide thickness at the active area (AA) adjacent to the shallow trench, increases the threshold of the parasitic corner device and reduces sub Vt (threshold voltage) and junction leakage.

4 Claims, 2 Drawing Sheets

NITROGEN IMPLANTATION USING A SHADOW EFFECT TO CONTROL GATE OXIDE THICKNESS IN DRAM SEMICONDUCTOR

BACKGROUND OF THE INVENTION

1. Field of the Invention

The invention relates to fabrication of integrated circuit devices incorporating different thicknesses of gate oxides by using nitrogen implantation. Either angled nitrogen implantation or nitride spacers are used to create a "shadow effect", which limits the nitrogen dose close to the edges of the active area. This reduction of nitrogen dose leads to an increased gate oxide thickness at the active area adjacent to the shallow trench and increases the threshold of the parasitic corner device and reduces sub Vt (threshold voltage) and junction leakage.

2. Description of the Related Art

In the arrangement of DRAM cell processing using a shallow trench isolation region to realize a small-size capacitor, gate oxide reliability of support oxides is limited by the thickness of the gate oxide at the AA (active area) corners. Therefore, careful optimization of the AA oxidation, (sacrificial) oxide, and gate oxidation is necessary to create the required AA corner rounding and the oxide thickness at the AA corner. In fact, in all too many instances, the oxide is thinner at the corners than at the AA area.

U.S. Pat. No. 5,330,920 discloses a method of controlling gate oxide thickness in the fabrication of semiconductor devices. The process comprises:
  forming a sacrificial gate oxide layer on select locations of a semiconductor substrate surface;
  implanting nitrogen ions into the select locations of the substrate through the sacrificial gate oxide layer;
  thermally annealing the substrate and sacrificial gate oxide layer to assist pile-up of he nitrogen ions at the semiconductor substrate surface;
  removing the sacrificial gate oxide layer; and
  thermally forming a gate oxide layer on the silicon semiconductor substrate surface, wherein the select locations having nitrogen ion implanted will have a thinner gate oxide layer than a non-implanted region.

Fabrication of an integrated device using nitrogen implantation is disclosed in U.S. Pat. No. 6,037,639. The process comprises:
  providing a channel region defined by a source and drain region of a semiconductor substrate having a gate structure comprising an isolating oxide layer positioned on the channel region and the polysilicon layer positioned on the oxide layer. More specifically, the process comprises forming the nitrogen implanted regions over the semiconductor substrate by implanting nitrogen atoms into those regions and growing spacers from exposed portions of the polysilicon layer. During the spacer growth, the spacer grows vertically as well as laterally extending under the polysilicon edges. Diffusion of nitrogen atoms to the substrate surface forms silicon nitride under the gate edges, which minimizes current leakages into the gate polysilicon.

U.S. Pat. No. 5,920,779 disclose a process for differential gate oxide thickness by nitrogen implantation for mixed mode and embedded VLSI circuits comprising:
  providing a semiconductor substrate having a surface, the semiconductor substrate comprising a first region on which a plurality of first MOS devices are to be formed and a second region on which a plurality of second MOS devices are to be formed;
  masking the second region and providing a first concentration of a first dopant in the semiconductor substrate at the surface of the first region without doping the second region;
  removing the mask over the second region;
  masking the first region and providing a second concentration of a second dopant in the semiconductor substrate at the surface of the second region without doping the first region, wherein the second concentration is different than the first concentration;
  oxidizing the surface of the semiconductor substrate to grow a first thickness of oxide on the first region of the semiconductor substrate and to grow a second, different thickness of oxide on the second region in a single oxidizing process; and
  forming first MOS devices on the first regions of the semiconductor substrate incorporating the first thickness of oxide and forming second MOS devices on the second region incorporating the second thickness of oxide;
  wherein the first and second dopants are both nitrogen and the first concentration is greater than the second concentration.

In general, a typical way to achieve two oxide thicknesses in one oxidation step is to make use of local nitrogen implantation to reduce the oxidation rate at the implanted sites.

The use of local nitrogen implementation to achieve two oxidation thicknesses in one oxidation step consist of utilizing the process integration scheme of:
  growing of the sacrificial oxide;
  implantation of dopants through the sacrificial oxide;
  employing a photoresist mask to pattern an integrated circuit that includes the first transistor having a first dielectric thickness and a second transistor having a second dielectric thickness;
  implanting nitrogen ions to create dual gate oxide devices;
  stripping off the photoresist mask and the sacrificial oxide; and
  subjecting the gate to oxidation.

Due to the fact that, in many cases, the gate oxide reliability of support oxide is limited by the thickness of the gate oxide at the AA (active area) corners, and careful optimization of AA oxidation, sac oxide, and gate oxidation is necessary to create the required AA corner rounding and the oxide thickness at the AA corner, there is a need to limit the dual gate nitrogen dose in the AA to the inner part of the gate area to provide increased gate oxide thickness at the active area corner and thereby increase the threshold of the parasitic corner device, reduce sub Vt (threshold voltage) and junction leakage.

SUMMARY OF THE INVENTION

One object of the present invention is to provide a dual gate oxide process for high performance DRAM systems to limit the dual gate nitrogen dose in the AA adjacent the STI oxide by use of a "shadow effect".

Another object of the present invention is to provide a dual gate oxide process for high performance DRAM systems that limit the dual gate nitrogen dose in the AA to the inner part adjacent the STI oxide by use of a "shadow effect" by eliminating the use of vertical nitrogen ion implantation under non-channeling conditions.

A further object of the present invention is to provide a dual gate oxide process for high performance DRAM systems by utilizing either an angled nitrogen ion implantation or nitride deposition to limit the nitrogen dose in the AA to the inner part adjacent the STI oxide by creating a "shadow effect" from the STI oxide which serves to reduce the $N_2$ dose at the AA edge to create an increased gate oxide at the AA corner and thereby increase the threshold of the parasitic corner device, and reduce sub Vt (threshold voltage) and junction leakage.

These and other objects of the invention will become more apparent by reference to the Brief Description Of The Drawings and Detailed Description Of The Preferred Embodiment Of The Invention.

DETAILED DESCRIPTION OF PREFERRED EMBODIMENT OF THE INVENTION

Figure 1:
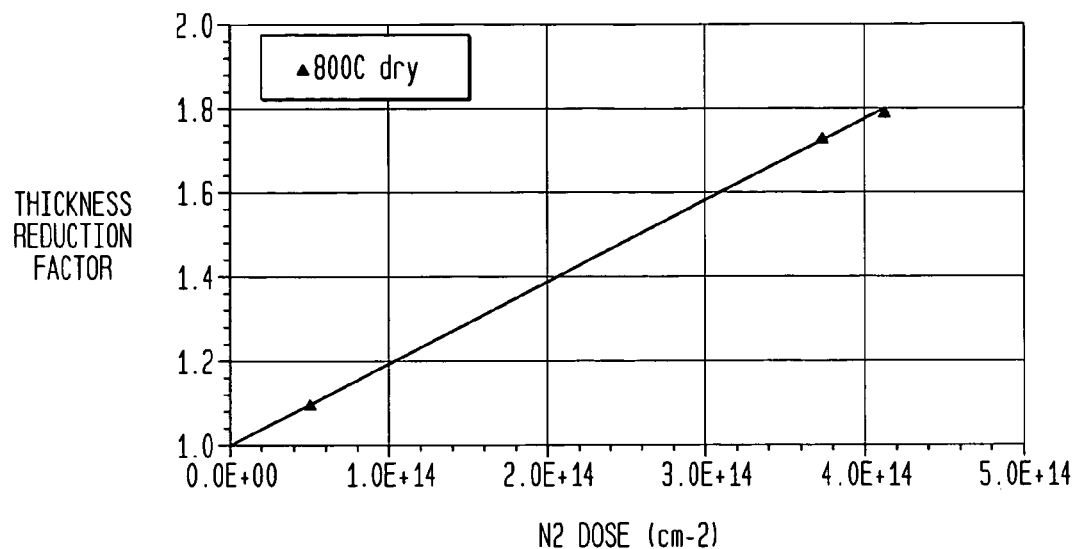
FIG. 1 is a graph comparing thickness reduction factor versus level of nitrogen dosage by implantation for a 800° C. dry oxidation in pure oxygen.

In general, the invention process scheme for providing angled nitrogen implantation into the gate area to create a "shadow effect" during implantation is accomplished by:
  providing an AA (etching, oxidation, fill, planarization, and a pad nitride strip);
  growing a sacrificial oxide on the substrate;
  providing masking steps for channel implants;
  affecting channel implants;
  affecting a first angled nitrogen implantation without resist mask to create a "shadow effect" from the STI oxide to reduce the $N_2$ dose at the AA edge to provide increased thickness gate oxide at the AA corners;
  providing a masking step for nitrogen ion implantation; and
  affecting a second angled nitrogen implantation to create a "shadow effect" from the STI oxide to reduce the $N_2$ dose at the AA edge to provide increased thickness gate oxide at the AA corners.

In particular, the process flow for fabricating a dynamic random access memory cell utilizing angled nitrogen implantation of the invention will entail:
  1) a. forming the active area by the well-known process of forming over a substrate, a patterned hard mask layer exposing portions of the substrate so as to define an isolation region;
  b. etching exposed regions of the substrate using the patterned hard mask layer to form an isolation trench in the isolation region;
  c. oxidizing the substrate to form a thermal oxide layer in the isolation trench;
  d. depositing an oxide layer over the thermal oxide layer to fill unfilled portions of the isolation trench;
  e. removing the patterned hard mask;
  f. planarizing the substrate and forming a pad nitride strip;
  2) forming a sacrificial gate oxide layer in the areas of the semiconductor substrate where the pad nitride has been stripped off;
  3) affecting channel implants in selected areas using resist masks;
  4) affecting a first low dose angled nitrogen implant without using an implant mask in a manner to limit the nitrogen dose in the active area to the inner part of the gate area so that the angled nitrogen dose in the "shadow part" of the active area is less than the amount of the nitrogen dose implanted in the remaining non-shadowed area (to affect the spatial thickness distribution of all exposed oxide areas);
  5) affecting masking so that nitrogen ions ($N_2^+$) to be implanted do not penetrate the masked region; and
  6) affecting a second angled nitrogen ion implantation in a manner so as to limit the dual gate nitrogen dose in the active area to the inner part of the gate area so that the angled nitrogen dose in the "shadow part" of the active area is less than the amount of the nitrogen dose implanted in the remaining non-shadowed area.

In general, nitrogen ion implantation is known to be done vertically under non-channeling conditions in the prior art, where the goal of the nitrogen ion implantation is to create a thinner oxide in the implanted areas, thereby leading to two oxide thicknesses for the non-implanted area and the nitrogen implanted area.

Reference is now made to FIG. 1, which shows a graph of thickness reduction due to $N_2$ implantation followed by a thermal oxidation in pure oxygen at a temperature of 800° C. The thickness reduction factor is defined as the ratio of the oxide thickness without nitrogen implant divided by the oxide thickness with nitrogen implant.

Figure 2:
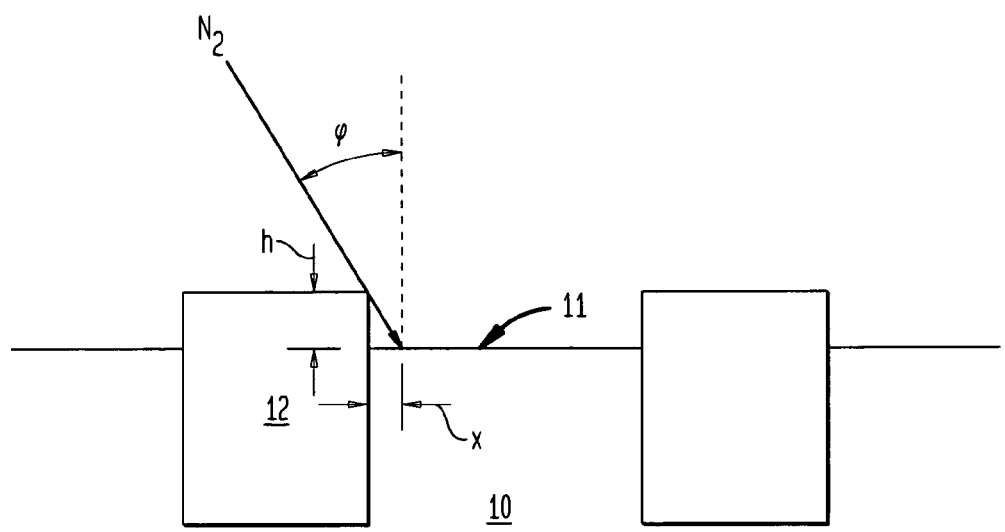
FIG. 2 is a diagram depicting nitrogen implantation at a non-vertical angle v with respect to the wafer surface at the normal, in which the AA at the inner part adjacent the STI oxide is under a "shadow effect".

In the context of the invention process, reference is made to the schematic diagram of FIG. 2 which shows nitrogen ions $N_2$ implanted under an angle v with respect to the normal surface of the AA 10 of the wafer surface 11. Two implantations are conducted under +v and under −v. The nitrogen dose in the shadow area of the AA is half the amount of nitrogen ion dose implanted in the remaining, non-shadowed area.

The length of the shadow area x is calculated according to the following formula:

$$\text{Tan } v = x/h$$

where h is the height of the STI oxide 12 over the AA surface. When h=500 A (+/−150 A) and v=60 degrees the maximum value for x=866 A. If an angle of 15 degrees is chosen, x=130 A (+/−40 A). The shadow length can be chosen over a long range. The goal for x is approximately 10% of the ground rule, e.g. 100 A–170 A in the existing microelectronic technologies.

To comprehend the effect of the nitrogen implantation on oxide thickness, thick and thin oxides within the framework of dual gate technology are discussed separately.

1) Thick oxide: In the dual gate process known in the art, the thick oxide is not exposed to a nitrogen implantation. The invention uses a low dose nitrogen implant for the thick oxide to modify and optimize its spatial thickness distribution. The nitrogen dose is chosen to be 5e13-1e14 $cm^{-2}$. For the case 1e14 $cm^-$ and using 800° C. oxidation, a reduction of the oxide thickness of approximately 20% is achieved in the non-shadow region of the gate. In the shadow regions where only 5e13 cm−2 is implanted, the oxide thickness is reduced by only 10%.

2) Thin oxide: The nitrogen dose is chosen to be approximately 4e14 cm$^{-2}$. This gives a reduction of 70% with respect to the non-implanted case, or 50% to the case of the 1e14 cm$^{-2}$ implanted thick oxide. The oxide at the STI oxide edges is 35% thicker than in the non-shadow region.

Figure 3:
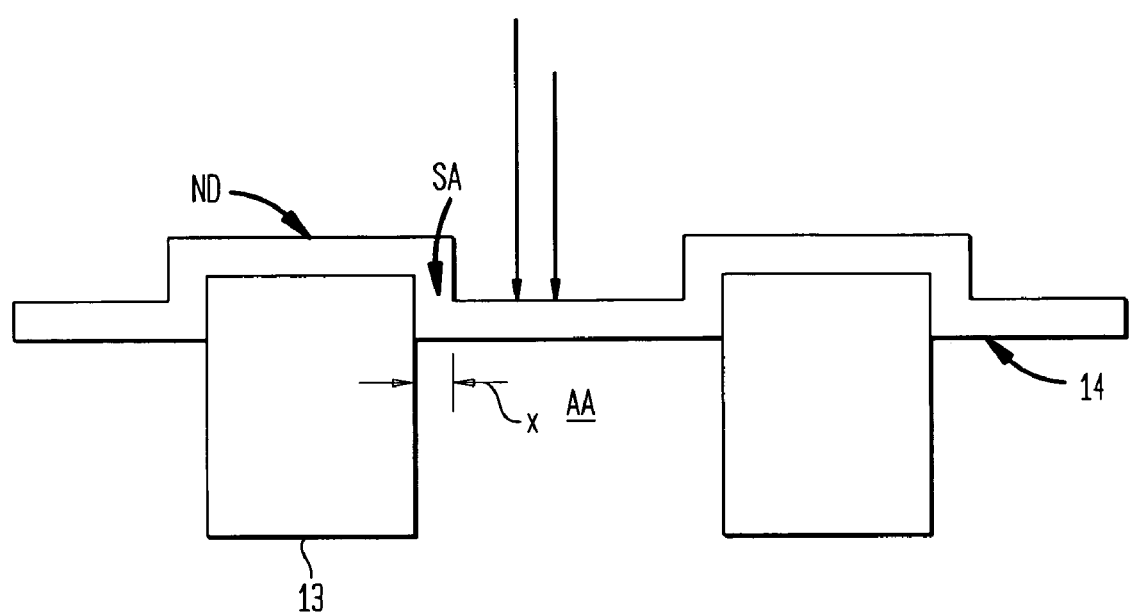
FIG. 3 is a depiction of an alternative integration scheme using a nitride deposition to create the "shadow effect" and in which the shadow is complete without the necessity to use angled nitrogen ion implantation to reduce the dual gate nitrogen dose adjacent the STI oxide.

FIG. 3, shows an alternative embodiment of the invention process that provides a "shadow effect" or shadow area SA which is complete or fixed, thereby eliminating the need to utilize angled nitrogen ion implantation and yet, achieve benefits as though angled nitrogen implantation had been used.

In this alternative embodiment of the invention process, the integration scheme utilizes a nitride spacer deposition to provide the shadow effect. In this alternative embodiment, a nitride deposition ND such as that of silicon nitride is performed after the channel implantation steps. Thereafter, optionally, steam oxidation may be employed to convert the nitride layer into an oxide. Following conversion of the nitride layer into an oxide by steam oxidation, vertical implantation of nitrogen ions as shown by the two downwardly pointing arrows is employed. Since the "shadow effect" as shown by x results from the nitride deposition, vertical nitrogen ion implantation still results in less nitrogen ion implantation in the area adjacent the STI oxide 13 as shown by x, than in the active area AA of wafer surface 14.

In this alternative integration scheme of the process of the invention, since the "shadow effect" is complete by virtue of the nitride deposition, it is not necessary to use angled nitrogen ion implantation.

We claim:

1. A process for forming dual gate oxides for use in high performance DRAM systems or logic circuits, the process comprising using a shadow area to control gate oxide thickness at active area (AA) corners adjacent a shallow trench isolation (STI) region, the process comprising:

providing a substrate having formed thereon an active area and the shallow trench isolation, the shallow trench isolation being filled with an oxide material having an exposed surface protruding above adjacent areas of the substrate;

affecting a first low dose angled nitrogen implant into the substrate at an angle such that a shadow area is formed adjacent to the oxide material, the nitrogen dose in the shadow area of the active area being less than the amount of the nitrogen dose implanted in the remaining non-shadowed area;

affecting a first mask so that nitrogen ions ($N_2^+$) to be implanted do not penetrate a masked region; and affecting a second nitrogen ion implantation by employing a second shadow area inducing means at a temperature sufficient to provide a lesser amount of nitrogen ion dosage in the second shadow area of the active area is less than the amount of nitrogen dose implanted in the remaining non-shadowed area.

2. The process of claim 1 wherein said second shadow area inducing means is by angled nitrogen ion implantation at an angle either greater or less than 90° with respect to the surface normal of said semiconductor substrate.

3. The process of claim 2 further comprising affecting an oxidation of the substrate wherein said oxidation is performed at about 900° C. under dry conditions.

4. The process of claim 2 further comprising affecting an oxidation of the substrate wherein said oxidation is performed at about 800° C. under a combination of dry and wet oxidation conditions.

* * * * *